United States Patent [19]

Coats et al.

[11] 4,381,421
[45] Apr. 26, 1983

[54] ELECTROMAGNETIC SHIELD FOR ELECTRONIC EQUIPMENT

[75] Inventors: Warren D. Coats, Newberg, Oreg.; Marc A. Kamerling, Santa Rosa, Calif.

[73] Assignee: Tektronix, Inc., Beaverton, Oreg.

[21] Appl. No.: 164,874

[22] Filed: Jul. 1, 1980

[51] Int. Cl.³ .............................................. H05K 9/00
[52] U.S. Cl. ..................................... 174/35 R; 358/245
[58] Field of Search ....................... 174/35 MS, 35 R; 358/245, 247; 219/10.55 D; 313/313, 402, 408

[56] References Cited

U.S. PATENT DOCUMENTS

| | | | |
|---|---|---|---|
| 2,673,342 | 3/1954 | Sims, Jr. et al. | 358/245 |
| 3,952,152 | 4/1976 | Lill et al. | 358/245 |
| 4,008,383 | 2/1977 | Tanaka et al. | 219/10.55 D |
| 4,051,341 | 9/1977 | Tanaka et al. | 174/35 MS X |
| 4,246,613 | 1/1981 | Choder et al. | 358/245 |
| 4,247,737 | 1/1981 | Johnson et al. | 174/35 MS |

*Primary Examiner*—A. T. Grimley
*Assistant Examiner*—D. A. Tone
*Attorney, Agent, or Firm*—Thomas J. Spence; John H. Bouchard

[57] ABSTRACT

A substantially transparent interference shield wherein a flexible material employed to form an interlayer laminating a thin metal screen between two panels of glass is extended beyond the periphery of the panels a distance less than the screen so as to provide the necessary support permitting the shield to be mounted in a surrounding frame solely by clamping engagement of the extended screen. Provision is also made for the additional encapsulation within the flexible material of a resilient gasket employed to enhance electrical contact between the screen and the frame.

15 Claims, 7 Drawing Figures

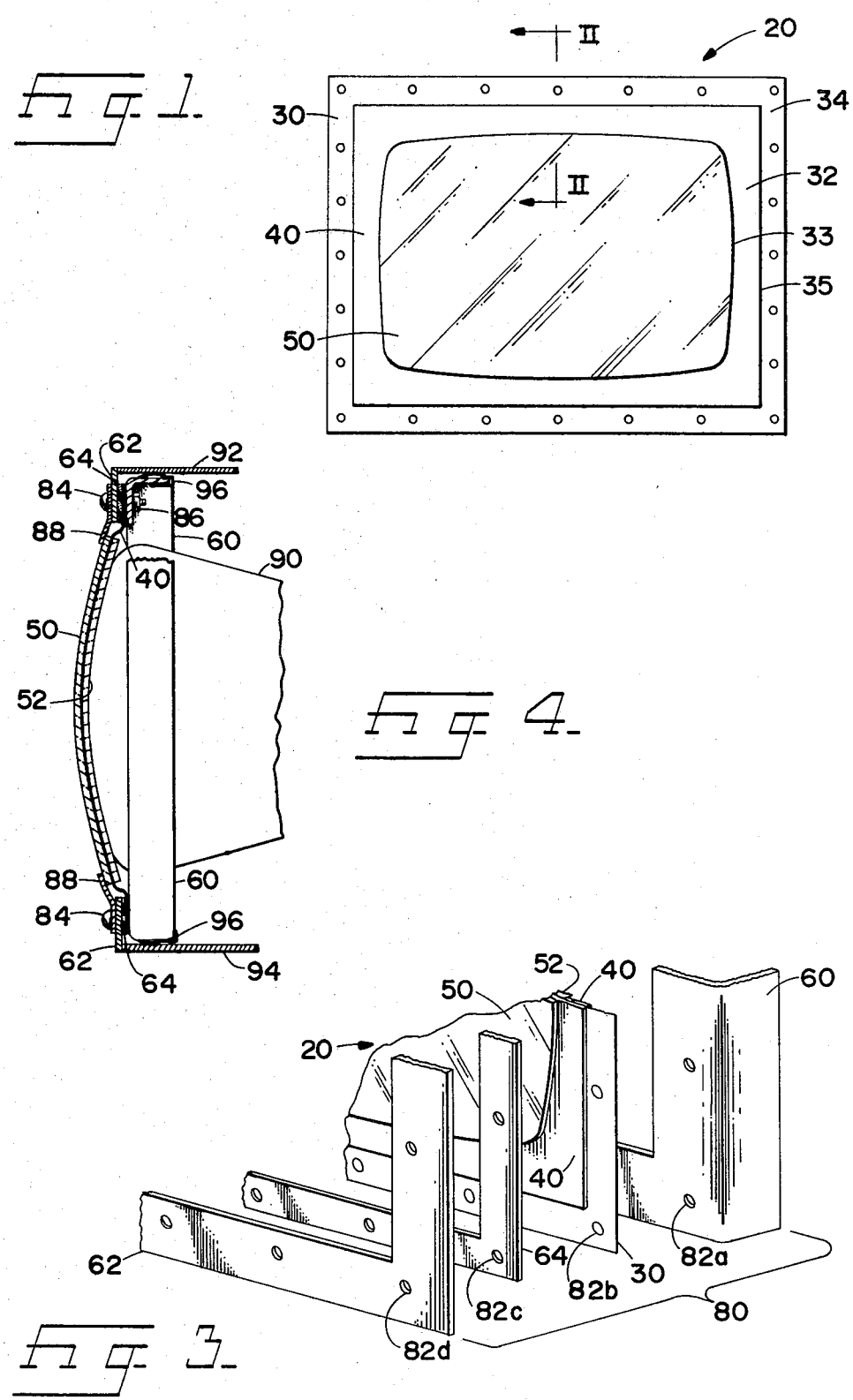

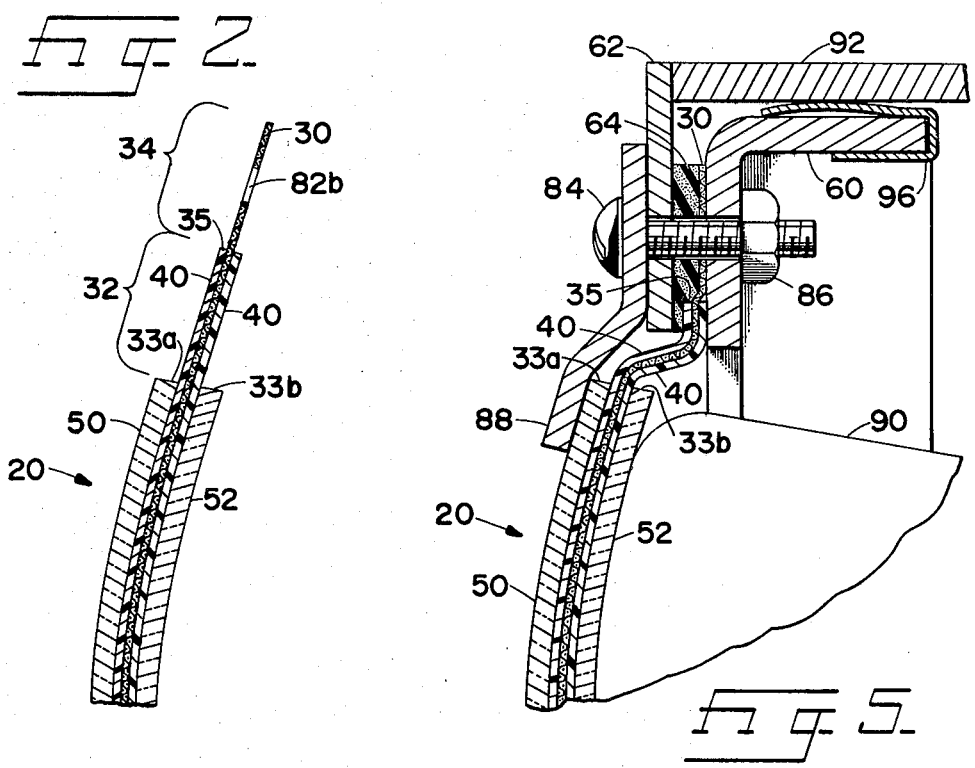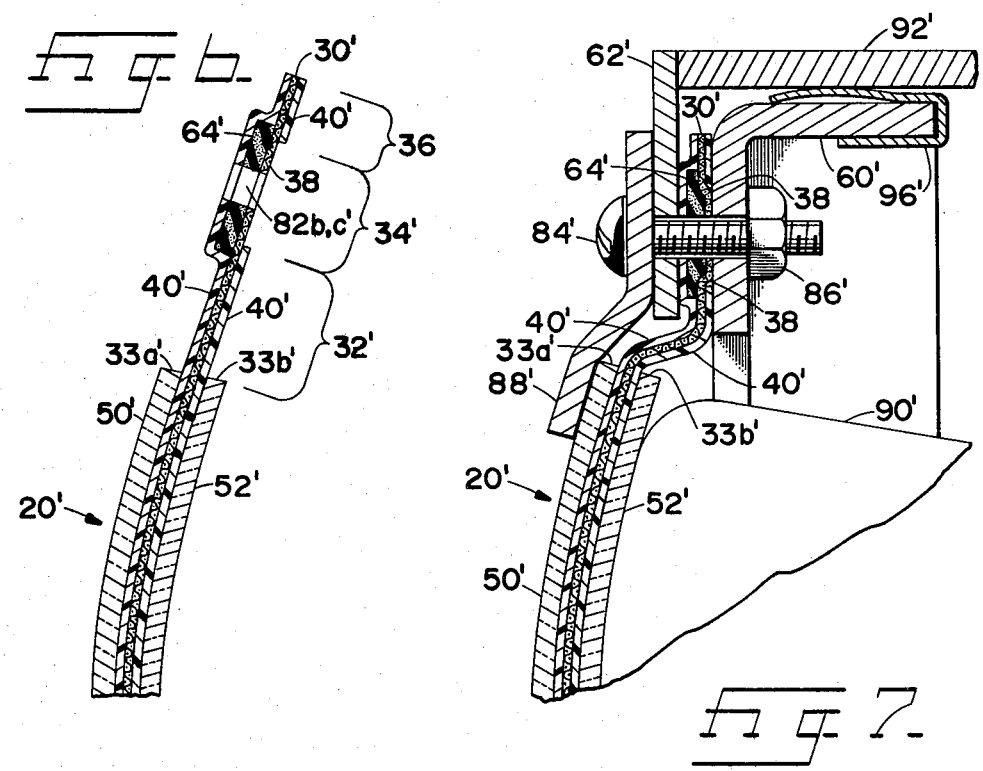

ELECTROMAGNETIC SHIELD FOR ELECTRONIC EQUIPMENT

BACKGROUND OF THE INVENTION

The subject matter of the present invention pertains to means for preventing compromising emanations from electronic equipment; in particular, electronic equipment employing a cathode-ray tube as an information display element.

As defined by the U.S. Air Force in its publication entitled *What You Should Know About Compromising Emanations (Tempest)*, OPR: AF COMSEC Center, a compromising emanation is "electromagnetic energy unintentionally emitted from equipment processing classified information and having some characteristic that makes it possible to intercept and recover the classified information." In the military sense, for a device to emit a compromising signal, the device must contain classified information. If there is no classified information, there can be no compromising signal. In the more general sense, a compromising emanation may be considered to include any detectable signal containing information, for example, industrial information, that a device user would rather not have known outside his or her organization.

Several schemes have been developed for reducing or eliminating unwanted emanations from electronic equipment. The most common scheme is to enclose the equipment completely within a surrounding metal enclosure connected electrically to ground or other common level of electrical potential. A special case arises, however, when the equipment being treated includes a visual display element, such as a cathode-ray tube, the display screen of which cannot be hidden behind a solid metal barrier.

Known prior art schemes for shielding cathode-ray tube display screens against unwanted non-visual emanations include a woven metallic screen soldered or welded to a surrounding metal frame placed in front of the display screen and connected to a metal enclosure surrounding the remainder of the tube. An example of such a shield is disclosed in Lill et al U.S. Pat. No. 3,952,152 and, according to Lill et al, in Simms et al U.S. Pat. No. 2,673,342.

A more pertinent scheme comprises the lamination of a fine wire mesh between two panels of glass to form an essentially transparent shield that may be placed over the display screen of a cathode-ray tube and its wire mesh connected electrically to a metal enclosure surrounding the remainder of the instrument. To facilitate connecting the wire mesh to the metal enclosure, the mesh is folded around the edge of the glass panels to form a peripheral border which may be pressed into contacting engagement with a similarly configured frame that provides the actual connection to the enclosure. A principal disadvantage of such a scheme is that it requires the frame to conform in size and shape to the glass panels. This disadvantage is particularly evident when the shield is curved. In such a case, the metal frame must also be curved; a requirement calling usually for a frame of rather expensive molded or milled construction.

SUMMARY OF THE INVENTION

The present invention is directed to an interference shield for preventing or minimizing undesired signal emanations from an electronic device including a visual information display element. More particularly, the shield of the present invention comprises a fine screen material encapsulated in polyvinyl butyral (PVB) and laminated between two panels of glass, with a first portion of PVB-encapsulated screen extending beyond the periphery of the glass panels a distance sufficient to permit its mechanical engagement by a surrounding metal or metallized frame, and a second portion of non-encapsulated bare screen extending a further distance sufficient to permit its concomittent electrical contact with the same frame.

In use, the shield is mounted mechanically and electrically in the frame to form an assembly that may be placed over the display screen of a cathode-ray tube or other display element and connected to a metal cabinet surrounding the remainder of the device so as to completely enclose the device within an emanation-attenuating enclosure. The partial encapsulation of the protruding screen material within the more flexible PVB provides both shock absorption and strain relief for the screen material that is otherwise too fragile to permit even routine handling without danger of cracking or breaking. In fact, the protruding screen is so strengthened by the encapsulating PVB that the fairly heavy glass panels may be supported within the surrounding frame solely by the encapsulated mesh. A principal advantage of such a connection between the glass panels and the surrounding frame is the ease with which a curved shield may be interfaced with a relatively simple planar frame. Such as interface capability not only permits the frame to be of simple construction, since it need conform closely to neither the shape or size of the glass panels, but is also permits the electrical contact to be made between the shield and the frame merely by sandwiching the unencapsulated portion of the screen between two planar sections of a frame assembly.

It is, therefore, a principal objective of the present invention to provide an interference shield of the type described that may be readily interfaced with a simple surrounding frame.

It is an additional principal objective of the present invention to provide an improved means for interfacing a curved interference shield of the type described with a surrounding planar surface.

It is a further objective of the present invention to provide an interference shield of the type described that is self-supporting within a surrounding frame assembly.

It is a feature of the interference shield of the present invention that it may be mounted in a surrounding frame solely by mechanical engagement of its laminated interlayer.

The foregoing objectives, features, and advantages of the present invention will be more readily understood upon consideration of the following detailed description of the invention taken in conjunction with the accompanying drawings.

BRIEF DESCRIPTION OF THE DRAWINGS

FIG. 1 illustrates a front view of the interference shield of the present invention.

FIG. 2 illustrates a side view of the interference shield of the present invention.

FIGS. 3 through 5 illustrate the structural characteristics associated with the interference shield of the present invention, and the manner by which the shield is joined mechanically and electrically as a result thereof.

FIGS. 6 and 7 illustrate an alternative embodiment of the interference shield of the present invention.

DETAILED DESCRIPTION OF THE INVENTION

Referring first to FIGS. 1 and 2 of the drawings, the interference shield of the present invention, denoted generally as 20, is disclosed as comprising a screen 30 partially encapsulated in an interlayer 40 of thermoplastic material and laminated between two rigid panels 50, 52 of optically transparent material, with a first encapsulated portion 32 of the screen 30 extending a first distance beyond the peripheral edge 33 of the panels and a second bare portion 34 extending a second distance further beyond the peripheral edge 35 of the encapsulation.

The screen 30 may be of any suitable construction, such as finely perforated thin metal sheeting or finely woven or knitted wire mesh, capable of providing an acceptable combination of electromagnetic signal attenuation and visual signal transmission. A screen material found to be particularly suitable is formed of one mil diameter stainless steel wire woven 100 wires to the inch (100 mesh), flashed with copper and plated with one-half mil of silver to enhance its signal attenuation characteristics, and blackened by exposure to a silver sulfide solution to minimize its visual presence. The screen-encapsulating interlayer 40 may be any sufficiently flexible thermo-plastic material, such as polyvinyl butyral (PVB), capable of performing the disclosed encapsulation, lamination, and support functions. The two panels 50, 52 are preferably of high strength glass sheet and may be curved to conform in cross-section to the display screen of a particular cathode-ray tube (CRT) or other display element with which the shield 20 is to be used. Typical component dimensions for a 20" (diagonal) CRT shield are: for the screen 30, 21"×17"×approximately 0.030"; for the PVB interlayer 40, 19.5"×15.5"×approximately 0.060" (including the encapsulated mesh); and for each glass panel 50, 52, 17.3" by 13.3"×0.125" curved in accordance with a 32.5" spherical radius. Typical thickness of the complete shield 20 is approximately 0.315". It is understood that the dimensions cited are for purposes of illustration only and are not meant to limit in any way the scope of the invention.

In use, the shield 20 is joined mechanically and electrically, as disclosed in FIGS. 3, 4, and 5, with an inner frame member 60, an outer frame member 62, and an intermediate gasket member 64 to form a shield assembly 80 that may be placed over the display screen of a cathode-ray tube 90 or other display element from which undesired non-visual emanations are to be limited.

The inner frame member 60, and preferably the outer frame 62, may be of any suitable metallic material, for example, aluminum, affording both high electrical conductivity and structural rigidity. The gasket member 64 may be of any suitable resilient material such as neoprene or silicone sponge. Assembly of the shield components may be facilitated by a plurality of spaced and aligned apertures 82a-d formed about the periphery of each component through which a like plurality of fasteners such as bolts 84 may be inserted for engagement by nuts 86. The bolts 84 may also be used to secure a hold-down bracket 88 of any suitable configuration for holding the shield 20 against the display screen of the cathode-ray tube 90. Other suitable means may also be employed to maintain the shield components in assembly without departing from the invention as disclosed.

It is important to note the interrelationships between the dimensions of the shield 20 and those of the frame components 60, 62, and 64. As indicated in an earlier part of this specification, a distinguishing feature of the shield 20 is the extension of the PVB-encapsulated screen beyond the peripheral edge 33 of the glass panels 50, 52 a first distance sufficient to permit its mechanical engagement by the frame members 60, 62 and the further extension of the bare screen beyond the peripheral edge 35 of the PVB interlayer 40 a second distance sufficient to permit its concomitant electrical contact with the inner frame member 60. The dimensional interrelationships necessary to accomplish such engagement and contact are best understood with reference to the cross-sectional detail view of FIG. 5, wherein the PVB interlayer 40 is seen to extend from the top edges 33a,b of the glass panels 50, 52 a distance just sufficient to permit its clamping engagement between the inner and outer frame member 60, 62, and the bare screen 30 is seen to extend further a distance sufficient to permit its wide-area contact with the inner frame member 60. Enhancement of the clamping engagement of the PVB interlayer 40 and the electrical contact between the bare screen 30 and the inner frame 60 is provided by the interposition of the resilient gasket 64 between the two frame members. The primary advantage of the novel extension of the encapsulating interlayer 40 is the provision of both strain relief and shock absorption for the screen 30 that is otherwise too fragile to permit normal handling or to support the two glass panels 50, 52. It also facilitates the ready transition between the curved form of the glass panels and the planar form of the surrounding frame members 60, 62.

Also shown in FIG. 4 are the top and bottom members 92, 94 of a metal enclosure surrounding the remainder of the electronic device of which the cathode-ray tube 90 is a part, and a pair of elongate EMI/RFI spring clips 96 employed to facilitate continuous electrical contact between the top and bottom surfaces of the inner frame member 60 and the interior surfaces of the enclosure. Additional spring clips, or their equivalents, are also employed to connect the side surfaces of the frame to the sides of the enclosure to form a complete electrical seal around the periphery of the shield assembly 80.

Referring now to FIGS. 6 and 7, there is disclosed on alternate embodiment of the interference shield of the present invention wherein the resilient gasket member 64' has been fixed in place by a further extension of the material forming the encapsulating interlayer 40'. For ease of comparison, the component parts of the shield of FIG. 6 and the shield assembly of FIG. 7 have been given the same identifying numbers, only primed, as the corresponding components, if any, shown in FIGS. 2 and 5.

As shown in the figures, the primary difference between the alternate embodiment of the shield 20' and the embodiment described earlier is the further extension of the flexible material of the interlayer 40' to encapsulate in place the gasket 64' as well as the extreme outer periphery 36 of the screen 30'. Thus, the only part of the screen 30' not encapsulated wholly within the interlayer material, or covered by the gasket 64', is the surface 38 immediately opposite the gasket. This gasket-incorporating extension of the encapsulating interlayer 40' greatly enhances the strain relief and shock absorption afforded the fragile screen 30'. For ease of manufacture, the gasket 64' may be further fixed to the screen 30' by means of any suitable adhesive.

In use, the alternate shield 20' is mounted as before between an inner frame member 60' and an outer frame member 62' in a manner providing both mechanical engagement and wide-area electrical contact. Also as before, such mounting assembly may be facilitated by bolts 84' and nuts 86' or other suitable means.

It should be noted that the gasket 64' may be positioned on either side of the screen 30' as long as provision is made for the requisite electrical connection between the bare screen surface 38, the surrounding frame assembly, and the remainder of the equipment enclosure. For example, referring to FIG. 7, if the gasket 64' is positioned on the opposite side of the screen 30', the primary electrical contact would be between the bare screen surface 38 and the outer frame member 62' rather than the inner frame member 60'. It would therefore be necessary to increase the electrical connection between the outer frame member 62' and the enclosure members 92, 94, such as, for example, by the use of additional spring clips 96' about the periphery of the outer frame member.

The actual encapsulation and lamination of the shield of the present invention may be accomplished by any suitable method known to the art. Although such methods generally employ a first rigid material for the panels 50, 52 and a second flexible material for the laminating interlayer 40, a shield formed of a single transparent material having a rigid central portion of uniform thickness and a flexible peripheral portion of lesser thickness is considered to be within the scope of the invention as disclosed.

The terms and expressions which have been used in the foregoing specification are used therein as terms of description and not of limitation, and there is no intention in the use of such expressions, of excluding equivalents of the features shown and described or portions thereof, it being recognized that the scope of the invention is defined and limited only by the claims which follow.

We claim as our invention:

1. An interference shield for limiting non-visual emanations from an electronic device, said shield comprising an electrically conductive screen partially encapsulated within an optically transparent material defining a central portion of first uniform thickness and a peripheral portion of second thickness substantially less than said first thickness, and with a portion of said screen extending without encapsulation beyond said peripheral portion of said transparent material, said central portion of said transparent material being rigid, said peripheral portion being flexible.

2. An interference shield for limiting non-visual emanations from an electronic device, said shield comprising an electrically conductive screen partially encapsulated within an optically transparent material defining a central portion of first uniform thickness and a peripheral portion of second thickness substantially less than said first thickness, and with a portion of said screen extending without encapsulation beyond said peripheral portion of said transparent material, said central portion of said transparent material defining two sheets of a first rigid material and said peripheral portion defining a larger sheet of a second flexible material, said second material partially encapsulating a central portion of said screen and forming an interlayer laminated between said sheets of said first material.

3. The interference shield of claim 2 wherein said first material is glass and said second material is thermoplastic resin.

4. The interference shield of claim 3 wherein said thermoplastic resin is polyvinyl butyral.

5. The interference shield of claim 1, 2, 3, or 4 further comprising a resilient gasket configured so as to overlay one surface of said unencapsulated portion of said screen, and wherein said peripheral portion of said transparent material is extended so as to encapsulate a surface of said gasket facing away from said screen.

6. An interference shield for limiting nonvisual emanations from an electronic device, said shield comprising an electrically conductive screen partially encapsulated within an optically transparent material defining a central portion of first uniform thickness and a peripheral portion of second thickness substantially less than said first thickness, and with a portion of said screen extending without encapsulation beyond said peripheral portion of said transparent material; and a frame member having a central aperture formed there-through larger than said central portion of said transparent material, said peripheral portion of said material and said screen being of such dimensions that, with said central portion of said material positioned wholly within said aperture, said peripheral portion extends from said central portion a distance sufficient to permit its mechanical engagement by said frame member, said unencapsulated portion of said screen extending a further distance sufficient to permit its concomitant electrical contact with said frame member.

7. The interference shield of claim 6 wherein said frame member includes means for mechanically engaging said peripheral portion of said transparent material and means for electrically contacting said unencapsulated portion of said screen.

8. The interference shield of claim 7 wherein said mechanical engagement and electrical contact are uniform about the periphery of said transparent material and said screen.

9. The interference shield of claim 7 or 8 wherein said central portion of said transparent material is curved and wherein said mechanical engagement and electrical contact occur over a planar surface of said frame member.

10. An interference shield for limiting non-visual emanations from an electronic device, said shield comprising a sheet of electrically conductive screen partially encapsulated within a flexible material forming an interlayer laminated between two panels of a substantially rigid material, a first encapsulated portion of said screen extending a first distance beyond the periphery of said rigid material and a second unencapsulated portion of said screen extending a second distance beyond the periphery of said first portion.

11. The interference shield of claim 10 further comprising a resilient gasket configured so as to overlay one surface of said unencapsulated portion of said screen, and wherein said flexible material is extended so as to encapsulate a surface of said gasket facing away from said screen.

12. The interference shield of claim 10 wherein said rigid material is curved and wherein a part of said encapsulated screen and all of said unencapsulated screen extend from the periphery of said rigid material a distance sufficient to permit their conforming engagement with a surrounding planar surface.

13. An interference shield assembly comprising:
(a) a frame member having a central aperture formed therethrough;
(b) an interference shield including an electrically conductive screen partially encapsulated within a flexible material forming an interlayer laminated between two panels of rigid material, a first encapsulated portion of said screen extending a first distance beyond the periphery of said rigid material sufficient to permit its mechanical engagement by said frame member, and a second unencapsulated portion of said screen extending a second distance beyond the periphery of said first portion sufficient to permit its concomitant electrical contact with said frame member; and
(c) means for securing said shield to said frame member in a manner accomplishing said mechanical engagement and electrical contact.

14. The interface shield of claim 13 further comprising a resilient gasket configured so as to overlay one surface of said unencapsulated portion of said screen, and wherein said flexible material is extended so as to encapsulate a surface of said gasket facing away from said screen.

15. The interference shield assembly of claim 13 wherein said panels of said shield are curved and wherein said engagement by and contact with said frame member occur over a planar surface.

* * * * *

UNITED STATES PATENT AND TRADEMARK OFFICE
CERTIFICATE OF CORRECTION

PATENT NO. : 4,381,421
DATED : April 26, 1983
INVENTOR(S) : Warren Dale Coats and Marc Alan Kamerling It is certified that error appears in the above—identified patent and that said Letters Patent is hereby corrected as shown below:

Change Assignee to:

Tektronix, Inc., Beaverton, Oregon, and

Optical Coating Laboratory, Inc., Santa Rosa, California;

a part interest to each.

Signed and Sealed this

Third Day of January 1984

[SEAL]

Attest:

GERALD J. MOSSINGHOFF

Attesting Officer

Commissioner of Patents and Trademarks